United States Patent [19]
Gourdine

[11] Patent Number: 5,297,005
[45] Date of Patent: Mar. 22, 1994

[54] APPARATUS AND METHOD FOR COOLING HEAT GENERATING ELECTRONIC COMPONENTS IN A CABINET

[75] Inventor: Meredith C. Gourdine, Houston, Tex.

[73] Assignee: Energy Innovations, Inc., Houston, Tex.

[21] Appl. No.: 952,308

[22] Filed: Sep. 28, 1992

[51] Int. Cl.$^5$ .............................................. H05K 7/20
[52] U.S. Cl. ...................... 361/697; 361/695
[58] Field of Search ......................... 361/380–386, 361/390, 395, 399

[56] References Cited
FOREIGN PATENT DOCUMENTS 2585918 2/1987 France ................................ 361/384
148898 11/1981 Japan ................................ 361/383

OTHER PUBLICATIONS

Damm, Jr. "Convection Cooling Apparatus" IBM Tech. Disc. Bulletin, vol. 20, No. 7, Dec. 1977, pp. 2755–2757.

Antonetti et al, "Air Jet Spot Cooling" IBM Tech. Disc. Bulletin, vol. 19, No. 12, May 1977, pp. 4688–4689.

*Primary Examiner*—Gregory D. Thompson
*Attorney, Agent, or Firm*—Kenneth A. Roddy

[57] ABSTRACT

Electronic components in a cabinet having an exhaust fan that creates a primary air flow across the components are cooled by a cooling enclosure which encloses predetermined heat generating electronic components to isolate them from other electronic components in the cabinet. An air inlet conduit connects the cooling enclosure with the air inlets in the cabinet and an air outlet conduit connects the enclosure with the air outlets of the cabinet and the exhaust fan. The conduits and enclosure define a secondary air flow pathway across the isolated electronic components to the air outlets and exhaust fan. The secondary air flow is isolated from the primary air flow through the cabinet. The exhaust fan creating the primary air flow across the non-isolated components simultaneously creates a separate secondary air flow through the secondary air flow pathway across the isolated heat generating components whereby the non-isolated components and the isolated components are independently cooled by the primary air flow and secondary air flows, respectively, and the heat generated by the isolated components and non-isolated components is not mixed within the cabinet to maximize cooling of all components within the cabinet. The cooling enclosure may also contain a heat sink.

24 Claims, 2 Drawing Sheets

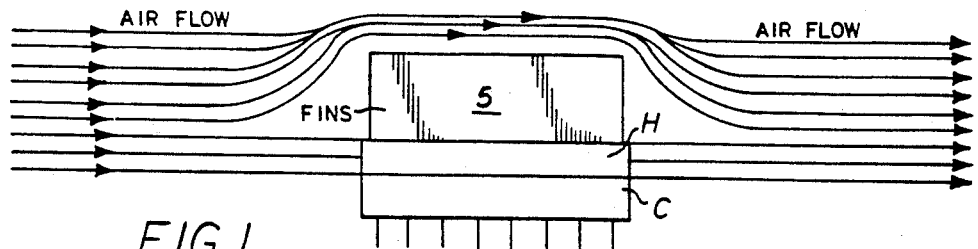
FIG. 1
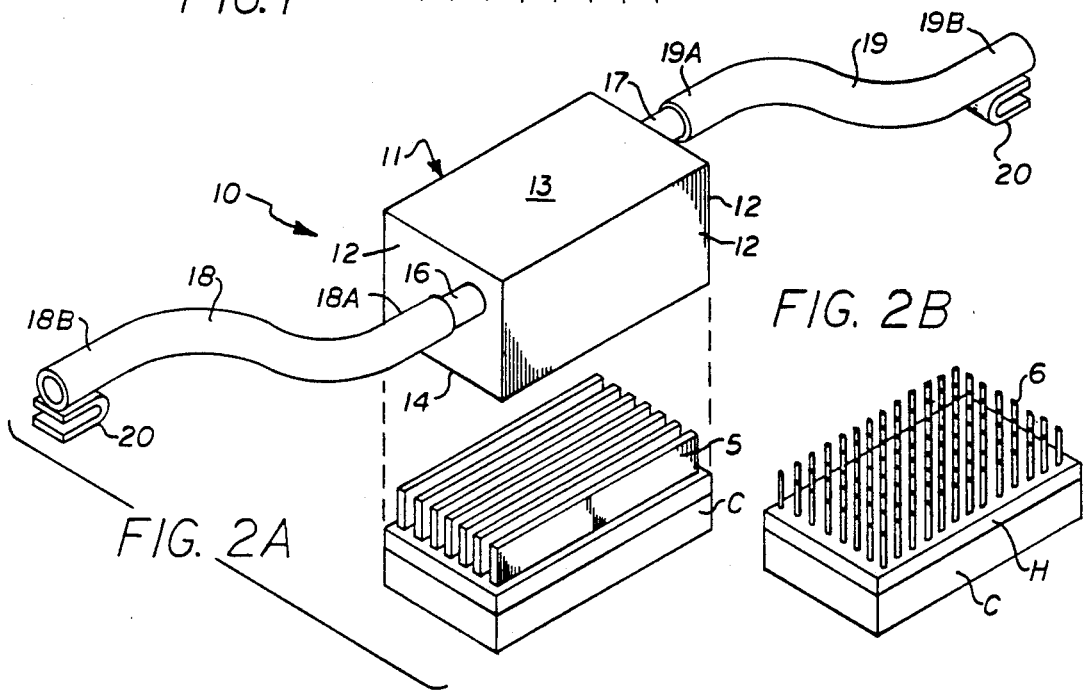
FIG. 2A
FIG. 2B
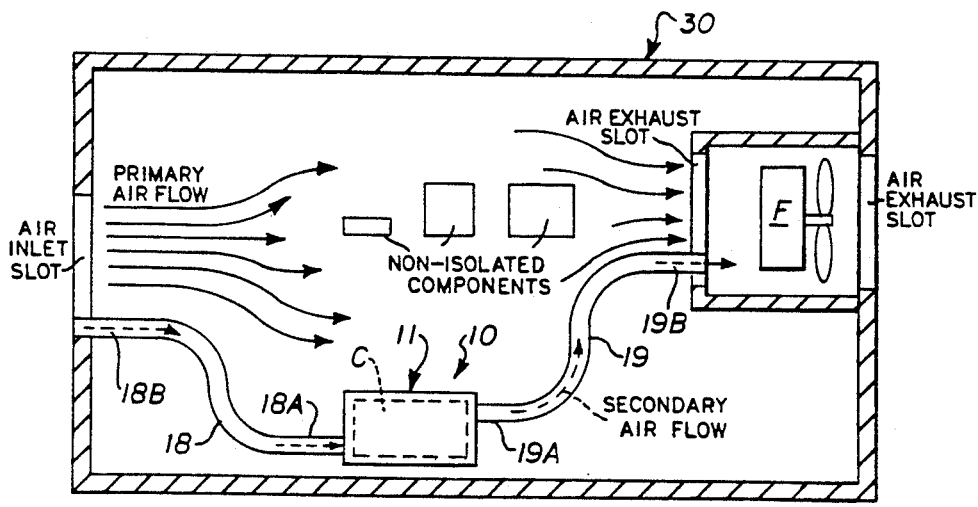
FIG. 3

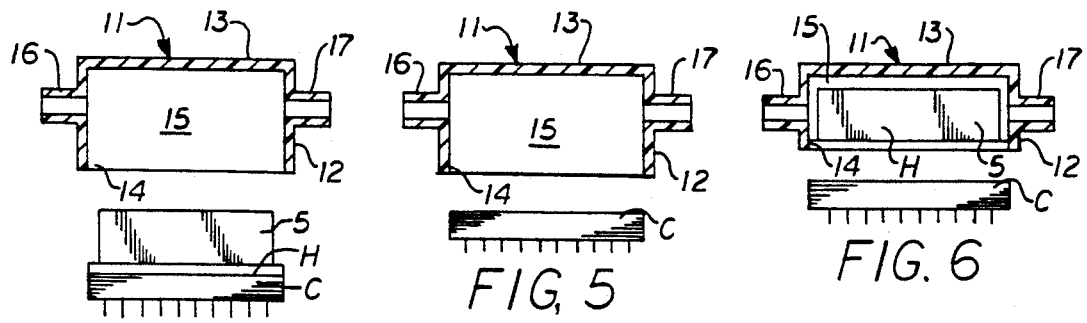
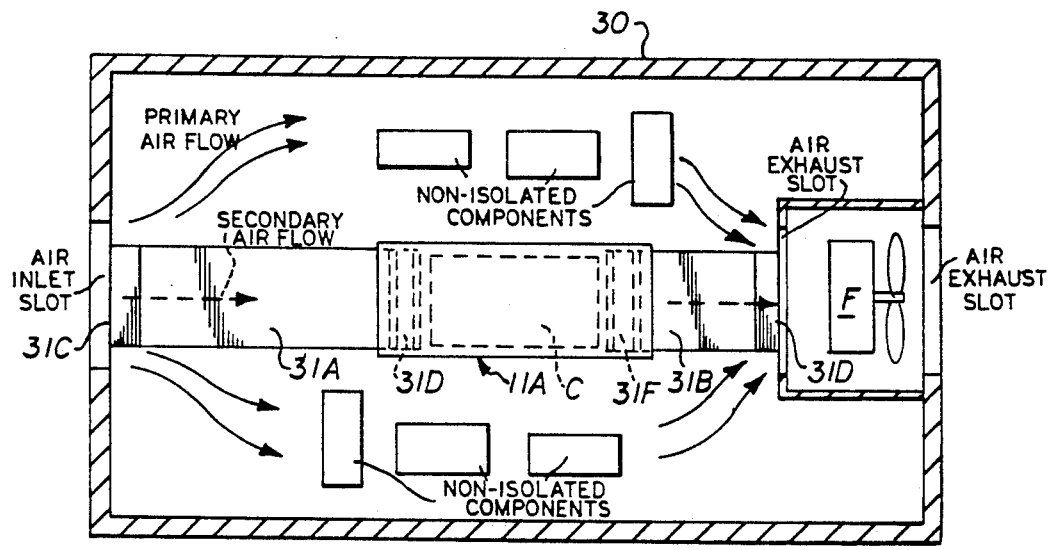
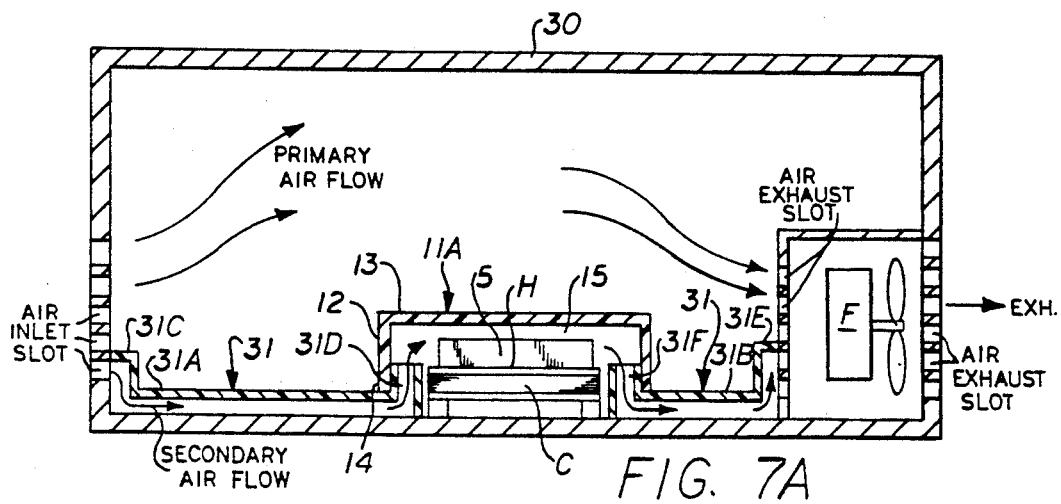

APPARATUS AND METHOD FOR COOLING HEAT GENERATING ELECTRONIC COMPONENTS IN A CABINET

BACKGROUND OF THE INVENTION

1. Field of the Invention

This invention relates generally to apparatus and methods for cooling electronic heat generating components within a cabinet and more particularly to a method and apparatus for cooling electronic components wherein predetermined heat generating electronic components are isolated from other electronic components in the cabinet and the isolated components are cooled by a secondary air flow isolated from the primary air flow through the cabinet such that the non-isolated components and the isolated components are independently cooled by the primary air flow and secondary air flow, respectively, and the heat generated by the isolated components and non-isolated components is not mixed within the cabinet to maximize cooling of all components within the cabinet.

2. Brief Description of the Prior Art

A common problem in electronic packaging is that the heat generated by the electronic components in the cabinet is detrimental to the components themselves, particularly integrated circuits and microprocessor chips in computer cabinets. Heat is normally removed by circulating air across the components by one or more low powered exhaust fans mounted in or on the computer cabinet.

The microprocessor chip in a computer generates a relatively large amount of heat and is susceptible to error or damage caused by overheating. For example, the Intel 80486 microprocessor chip generates 4.5 watts in normal operation and must be maintained below 85° C. or it can introduce error as well as reduce its operating life. Even newer chips will generate 15-30 watts. To assist heat removal from an integrated circuit chip, a heat sink is often mounted on the top surface of the chip. Heat sinks are metal devices that have a plurality of fins or pins extending from a base which is mounted on the chip surface to radiate or transmit heat from the chip to the circulating air. The fins are usually aligned longitudinally with the prevalent direction of air flow and when the air flow direction is uncertain, pin-type heat sinks may be used.

The exhaust fan in a computer cabinet usually develops a single air flow path wherein air from the cabinet exterior is drawn in through inlet slots in the cabinet wall flows across the components including the heat sink and is exhausted through exhaust slots in the fan motor housing in another wall of the cabinet. Although the heat sink is useful in cooling the microprocessor chip, the heat generated by the heat sink is mixed with the heat generated by the other components in the cabinet such that the effective cooling of all the components including the ones having heat sinks is diminished.

Others have attemted to solve the heating problem by mounting a small supplementary fan on the heat sink, and mounting liquid cooling devices (water jackets) or devices utilizing the Peltier effect on the chip to be cooled.

The present invention overcomes the heating problem by isolating predetermined heat generating electronic components which may include those with heat sinks from other electronic components in the cabinet and providing a secondary air flow pathway from the air inlets across the isolated electronic components to the air outlets and exhaust fan. The secondary air flow is isolated from the primary air flow. The exhaust fan in or on the cabinet creates a primary air flow across the non-isolated components between the air inlets and air outlets in the cabinet and exhausts the air to the cabinet exterior, and simultaneously creates a separate secondary air flow through the secondary air flow pathway across the isolated heat generating components between the air inlets and air outlets in the cabinet and exhausts the secondary air flow to the cabinet exterior. Thus, the non-isolated components and the isolated components are independently cooled by the primary air flow and secondary air flow, respectively, and the heat generated by the isolated components and non-isolated components is not mixed within the cabinet to maximize cooling of all components within the cabinet.

SUMMARY OF THE INVENTION

It is therefore an object of the present invention to provide an apparatus and method for effectively cooling heat generating electronic components in a cabinet.

It is another object of this invention to provide an apparatus and method for effectively cooling heat generating electronic components in a cabinet which isolates predetermined heat generating electronic components which may include those with heat sinks from other electronic components in the cabinet and provides a secondary air flow pathway from the cabinet exterior across only the isolated electronic components.

Another object of this invention is to provide an apparatus and method for effectively cooling heat generating electronic components in a cabinet which isolates predetermined heat generating electronic components from other electronic components in the cabinet and provides a primary air flow across the non-isolated components, and simultaneously creates a separate secondary air flow through the secondary air flow pathway across the isolated heat generating components whereby the non-isolated components and the isolated components are independently cooled by the primary air flow and secondary air flow, respectively, and the heat generated by the isolated components and non-isolated components is not mixed within the cabinet to maximize cooling of all components within the cabinet.

Another object of this invention is to provide a cabinet for housing electronic components which includes ductwork and an enclosure to enclose heat generating components and provide the enclosed components with a secondary air flow pathway across the isolated heat generating components whereby the non-isolated components and the isolated components are independently cooled by the primary air flow and secondary air flow, respectively, and the heat generated by the isolated components and non-isolated components is not mixed within the cabinet to maximize cooling of all components within the cabinet.

Another object of this invention is to provide a cooling apparatus which can be installed quickly and easily on heat generating electronic components within a cabinet without modification to the existing equipment.

Another object of this invention is to provide a cooling apparatus that can be installed quickly and easily on integrated circuit chips including those with heat sinks which allows upgrading and replacement of low powered chips with high powered chip without having to change the existing thermal management equipment.

A further object of this invention is to provide a cooling apparatus which will improve the thermal management system of cabinets containing heat generating electronic components.

A still further object of this invention is to provide a cooling apparatus for installation on heat generating electronic components which is simple in construction and inexpensive to manufacture.

Other objects of the invention will become apparent from time to time throughout the specification and claims as hereinafter related.

The above noted objects and other objects of the invention are accomplished by an apparatus and method for cooling electronic components which isolates predetermined heat generating electronic components which may include those with heat sinks from other electronic components in a cabinet and provides a secondary air flow pathway from the cabinet exterior across the isolated electronic components which is isolated from the primary air flow through the cabinet. The exhaust fan in or on the cabinet which creates a primary air flow across the non-isolated components between air inlets and outlets in the cabinet simultaneously draws air through the secondary air flow pathway across the isolated heat generating components and exhausts the secondary air flow to the cabinet exterior. Thus, the non-isolated components and the isolated components are independently cooled by the primary air flow and secondary air flow, respectively, and the heat generated by the isolated components and non-isolated components is not mixed within the cabinet to maximize cooling of all components within the cabinet.

BRIEF DESCRIPTION OF THE DRAWINGS

FIG. 1 is a schematic elevation view of an integrated circuit chip with a heat sink mounted thereon showing the air flow path around the heat sink.

FIG. 2A is an exploded isometric view of an embodiment of the apparatus in accordance with the present invention being placed over an integrated circuit chip with a heat sink mounted thereon.

FIG. 2B is an isometric view of a heat sink having pins.

FIG. 3 is a schematic plan view of a computer cabinet with the apparatus in accordance with the present invention installed over a component to be cooled.

FIG. 4 is a side view in partial cross section of the component cooling enclosure being installed on an integrated circuit chip with a heat sink mounted thereon.

FIG. 5 is a side view in partial cross section of the component cooling enclosure being installed on an integrated circuit chip without a heat sink.

FIG. 6 is a side view in partial cross section of the component cooling enclosure being installed on an integrated circuit chip wherein the heat sink is mounted within the cooling enclosure and the assembly is installed as a unit.

FIG. 7A is a schematic side view in partial cross section of a cabinet having ductwork built into the cabinet with the cooling enclosure installed on the component to be cooled.

FIG. 7B is a schematic top view of the cabinet of FIG. 7A.

DESCRIPTION OF THE PREFERRED EMBODIMENT

Integrated circuit chips, such as microprocessor chips generate a relatively large amount of heat and are susceptible to error or damage caused by overheating. For example, the Intel 80486 microprocessor chip generates 4.5 watts in normal operation and must be maintained below 85° C. or it can introduce error as well as reduce its operating life due to overheating. The integrated circuit chip is usually mounted with many other components on a circuit board in a cabinet which has a fan that draws air in from the cabinet exterior, circulates the air across all the electronic components, and then exhausts the air to the cabinet exterior in a single air flow path to cool the components. To assist heat removal from an integrated circuit chip, a heat sink is often mounted on the top surface of the chip by thermal adhesive, mechanical slots, or a combination thereof.

The conventional heat sink is a metal device having a plurality of fins or pins extending from a base which is mounted on the chip surface to radiate or transmit heat from the chip to the circulating air. The fins are usually aligned longitudinally with the prevalent direction of air flow and when the air flow direction is uncertain, pin-type heat sinks may be used.

Referring to the drawings by numerals of reference, there is shown schematically in FIG. 1, the air flow path through and around an integrated circuit chip C with a conventional heat sink H mounted thereon to assist heat removal from the integrated circuit chip. In FIG. 2A the heat sink H is shown with fins 5, and FIG. 2B shows a heat sink with pins 6.

As indicated by arrows in FIG. 1, some of the air flow is deflected around the heat sink H due to friction exerted on the flow as it passes through the fins 5 or pins 6. Part of the heat in the heat sink is carried away by the relatively high speed flow of air through the closely spaced fins or pins (convection), while the rest of the heat is conducted to the relatively slow speed flow above the heat sink. Convective heat transfer is generally more effective than conductive heat transfer.

Although mounting heat sinks to these types of chips will facilitate cooling of the chip to some extent, the heat generated by the heat sink is mixed with the heat generated by the other components in the cabinet such that the effective cooling of all the components including the ones having heat sinks is diminished.

Referring now to FIGS. 2A and 4, there is shown a cooling apparatus 10 in accordance with the present invention. The cooling apparatus 10 has a hollow housing 11 formed of electrically non-conductive material configured to enclose the heat generating electronic component C. In the illustrated embodiment, the housing 11 is a box-like enclosure having opposed side walls 12, a top wall 13, and an open bottom end 14 defining an interior cavity 15. An inlet port 16 is provided through one side wall and an outlet port 17 is provided through another side wall. A length of flexible conduit 18 is connected at one end 18A to the inlet port 16 and another length of flexible conduit 19 is connected at one end 19A to the outlet port 17. For purposes of illustration only one component C is shown, however, it should be understood that the housing 11 may be sized to enclose more than one component.

As best seen in FIG. 3, the free end 18B of the conduit 18 is adapted to be releasably attached to the side wall of a cabinet 30 in which the component C to be cooled is mounted and in fluid communication with at least one inlet slot of the cabinet through which fresh air normally enters. The free end 19B of the conduit 19 is adapted to be releasably attached to the housing of the exhaust fan F in or on the cabinet in which the component to be cooled is mounted and in fluid communication with at least one exhaust slot of the fan housing through which cabinet air is exhausted. Suitable mounting hardware, such as clips 20, may be secured to the free ends of the conduits 18 and 19 for attaching their free ends to the cabinet side wall and fan housing, respectively. In some instances, depending upon the size of the cabinet and fan housing slots, the free ends 18B and 19B of the conduits 18 and 19 may be simply inserted in the inlet and exhaust slots without requiring mounting hardware.

FIG. 4 shows an embodiment of the cooling enclosure 11 wherein the component to be enclosed is an integrated circuit chip C having a heat sink H with fins 5 mounted thereon. The open bottom end 14 of the housing or cooling enclosure 11 is configured to engage the top surface or sides of the component C to be cooled and the interior cavity 15 is sized to enclose the component leaving a space between the top of the component and the top wall 13 of the enclosure. The inlet and outlet ports 16 and 17 may be axially offset from one another to facilitate circulation of the air in the cavity 15. If the component C to be cooled has a heat sink H mounted thereon, the height of the inlet and outlet ports 16 and 17 are located relative to the heat sink to direct most of the air flow through the fins 5 or pins 6 rather than around the fins or pins to achieve greater cooling. The open bottom end 14 of the cooling enclosure 10 may be dimensioned to frictionally engage the sides of the component to be cooled, or may be installed on the component using a suitable flexible thermal adhesive.

FIG. 5 shows an embodiment of the cooling enclosure 11 wherein the component to be enclosed is an integrated circuit chip C without a heat sink. In this application, the open bottom end 14 of the enclosure 11 is configured to engage the sides of the chip C. A suitable thermal adhesive may be applied to the chip C to secure the enclosure 11 thereon.

FIG. 6 shows an embodiment of the cooling enclosure 11 wherein a heat sink is installed in the enclosure cavity 15 and the enclosure and heat sink assembly is supplied as a single unit to be mounted on the component to be cooled (integrated circuit chip C). In this application, the heat sink H is secured within the open end 14 of the enclosure 11 with its fins 5 or pins 6 extending upwardly into the cavity 15 of the enclosure. With a fin-type heat sink, the fins are aligned longitudinally with the prevalent direction of air flow between the inlet and outlet ports 16 and 17. In some applications, a pin-type heat sink as shown in FIG. 2D, may be installed in the enclosure 11. With the embodiment of FIG. 6, the flat bottom of the heat sink H is mounted on the top surface of the chip C by conventional means, such as a suitable thermal adhesive, mechanical slots, or a combination thereof.

It should be understood that although a box-like configuration has been illustrated as an example of a preferred embodiment, the cooling enclosure 11 may be cylindrical or configured otherwise to conform to the shape of the component to be cooled. It should also be understood that while flexible conduits are described in the preferred embodiment, that the conduits 18 and 19 may be rigid, or that ar passageways may be built into the cabinet chassis and connected to the component enclosure.

Referring again to FIG. 3, when the cabinet exhaust fan F is operating, a major portion of the outside air flows over the non-isolated components in the cabinet and through the exhaust slots in the fan housing. Simultaneously, a small portion of outside air, or secondary air flow, is drawn into the free end 18B of the conduit 18 from the air inlet slot in the cabinet and passes through the conduit into the enclosure 11 and across the isolated component C and through the outlet conduit 19 to be exhausted by the fan. The secondary air flow entering the enclosure 11 flows over the isolated component, and if the component has a heat sink, the air flows directly through the fins 5 or pins 6 of the heat sink.

Sufficient air flow is drawn across the isolated component C and through the fins or pins of the heat sink to achieve improved cooling of the isolated component without jeopardizing the cooling effects of the outside air circulating across the other non-isolated components (primary air flow). As a result, cooling of the other non-isolated components by the circulating air outside of the enclosure is improved because the primary air flow through the cabinet is not mixed with the secondary hot air emerging from the isolated component or heat sink. Also the air of the secondary air flow which cools the isolated component or heat sink is not mixed with heat from the other warm non-isolated components inside the cabinet. Thus, a double benefit is achieved by the separate primary and secondary cooling flows of air.

FIGS. 7A and 7B show a cabinet 30 which has air passageways built into the cabinet chassis to form the secondary air passageway. In this embodiment, the component C to be cooled is mounted on a circuit board in the cabinet 30 or other means conventional in the art. The cabinet 30 is provided with a system of conduit or hollow ductwork 31. The conduit or ductwork 31 has an air intake portion 31A which extends from the side wall of the cabinet containing the air inlet slots and an air outlet portion 31B which extends from the component C to the housing of the exhaust fan F. The air intake portion 31A of the ductwork 31 has one open end 31C positioned in fluid communication with at least one air inlet slot of the cabinet and another open end 31D positioned adjacent the component C. The air outlet portion 31B of the ductwork 31 has an open end 31E positioned in fluid communication with the housing of the exhaust fan F such that the fan will draw air through the ductwork and another open end 31F positioned adjacent the component C.

In the embodiment of FIG. 7A and 7B, the cooling enclosure 11A has side walls 12, a top wall 13, an open bottom end 14, and an interior cavity 15 configured to enclose the component C to be cooled. The side walls 12 of the enclosure are configured to surround the open ends 31D and 31F of the ductwork 31 adjacent the component C to be cooled. When the exhaust fan F is in operation, a major portion of the outside air flows over the non-isolated components in the cabinet and through the exhaust slots in the fan housing. Simultaneously, a secondary air flow, is drawn into the open end 31C of the ductwork from the air inlet slot in the cabinet and passes through the ductwork into the enclosure 11A covering the isolated component C and through the outlet portion of the ductwork to be exhausted by the fan. The secondary air flow entering the enclosure flows over the isolated component C, and if the component has a heat sink H, the air flows directly through the fins 5 or pins 6 of the heat sink.

It should be understood that the enclosure 11A may have inlet and outlet ports through the side walls, as previously described, which can be connected to the open ends of the ductwork. The enclosure 10A may also have a heat sink mounted in the interior cavity 15 and be installed as a unit on the component to be cooled.

The effectiveness of the present focused flow technique in providing greater cooling was tested by removing a microprocessor chip generating only 0.4 W from a PC computer and replacing it with a simulated Intel 80486 microprocessor chip (Intel Corporation) and heat sink generating 4.5 W. A conventional metal finned heat sink was mounted atop the simulated 80486 chip. The chip and heat sink was enclosed by a box-like cooling enclosure similar to that shown in FIG. 2.

A first temperature was obtained with the inlet and outlet conduits disconnected. With the computer and fan running and no air flow through the component enclosure, the temperature of the chip and heat sink rose to a temperature $T_s$ of 80° C. With the inlet tube and outlet conduits connected to an inlet slot on the cabinet housing and an exhaust slot on the fan housing, respectively, to direct a flow of air through the enclosure, the temperature fell to 55.5° C. As the safe operating temperature for the 80486 chip is 85° C., this experiment demonstrates the feasibility of upgrading computers by replacing a low powered chip with a high powered chip without the necessity of having to change the existing thermal management equipment (the exhaust fan).

The simulated 80486 chip and heat sink with the component cooling enclosure was also installed in a test fixture where the speed of air "u" approaching the heat sink fins could be measured. The temperature of the chip and heat sink $T_s$ was then measured, with an inlet air temperature $T_i$ of about 25° C. The tabulated results are shown in the chart below along with comparable data provided by Intel Corporation for the same chip and heat sink. It was found that for every value of air speed used, the chip and heat sink temperature is lower when the component cooling enclosure is used. It was also found that when the enclosed chip and heat sink were in the computer cabinet, the chip and heat sink temperature $T_s$ was lowered to approximately 55° C., and the speed of the air was 0.16 m/s corresponding to a mass flow rate of 0.00012 kg/s.

|  | TEMPERATURE OF CHIP | | |
|---|---|---|---|
| AIR SPEED "u" m/s | Without Heat Sink | With Intel Heat Sink | With Heat Sink & Focusing Device |
| 0.16 | 98° C. | 76° C. | 55° C. |
| 0.5 | 95° C. | 70° C. | 38° C. |
| 0.9 | 90° C. | 61° C. | 36° C. |
| 1.25 | 87° C. | 56° C. | 32° C. |

The following table summarizes the thermodynamic efficiency and performance results obtained with the simulated chip and heat sink (4.5 Watts) with an ambient temperature $T_i$ of approximately 25° C. at various air flow rates:
where $T_o$=the outlet air temperature,
where Q=4.5 Watts, and
where Heat Capacity of Air, c=approx. $10^3$ Joules/kg-C,
Thermodynamic Efficiency $E_f = (T_o - T_i)/(T_s - T_i)$, and
Convection Efficiency $E_c = Q_c/Q$.

| $T_s$ °C. | $T_i$ °C. | $T_o$ °C. | m kg/s | $E_f$ | $E_c$ | Pressure Drop N/m² | $\Delta T_s/Q$ °C./W |
|---|---|---|---|---|---|---|---|
| 55.5 | 25.7 | 43.3 | 0.00012 | 0.59 | 0.46 | 20 | 6.6 |
| 38.6 | 24.8 | 31.2 | 0.00035 | 0.46 | 0.51 | 97 | 3.0 |
| 36.0 | 24.8 | 29.9 | 0.00064 | 0.45 | 0.73 | 274 | 2.4 |
| 32.2 | 24.3 | 27.4 | 0.00088 | 0.39 | 0.60 | 685 | 1.7 |

The test results demonstrate that by isolating the chip and heat sink and subjecting the component to a separate secondary air flow greatly improves cooling and is a very cost effective method of improving the thermal management system of cabinets containing heat generating components. The present apparatus does not require modification of the existing equipment. By preventing the mixing of the hot air from the isolated component with the rest of the air circulating through the cabinet, both air flows cool the surfaces they contact more effectively, thereby increasing the overall effectiveness of cooling by the exhaust fan. Additional benefits of the improved cooling method include; the reduction of errors in integrated circuit chips due to chip overheating, increased useful life of the chip, and the capability of operating at higher chip speeds without overheating.

While this invention has been described fully and completely with special emphasis upon a preferred embodiment, it should be understood that within the scope of the appended claims the invention may be practiced otherwise than as specifically described herein.

I claim:
1. A method of cooling electronic components within a cabinet having an exhaust fan which creates a primary air flow across the components between air inlets and air outlets in the cabinet and exhausts the air to the cabinet exterior, comprising the steps of;
    enclosing at least one predetermined heat generating electronic component to isolate it from other electronic components in the cabinet, and
    providing a secondary air flow pathway from the air inlets across the enclosed heat generating electronic component to the air outlets and exhaust fan, the secondary air flow being isolated from the primary air flow, such that
    the fan in operation creates the primary air flow across the non-isolated components between the air inlets and air outlets in the cabinet and exhausts the air to the cabinet exterior, and
    simultaneously creates a separate secondary air flow through said secondary air flow pathway across the enclosed heat generating electronic component between the air inlets and air outlets in the cabinet and exhausts the secondary air flow to the cabinet exterior, whereby
    the non-isolated components and the enclosed heat generating electronic component are independently cooled by the primary air flow and secondary air flow, respectively, and the heat generated by the enclosed heat generating electronic component and the non-isolated components is not mixed within the cabinet to maximize cooling of all components within the cabinet.
2. A method of cooling electronic components according to claim 1 including the steps of;
    prior to enclosing the predetermined heat generating electronic component, mounting a heat sink member in thermal contact with the heat generating electronic component to be enclosed, the heat sink member having heat conduction means for conducting heat generated by the component to be enclosed; then enclosing the heat generating electronic component with the heat sink member mounted thereon to isolate it from other electronic components i the cabinet, and providing a secondary air flow pathway from the air inlets across the enclosed electronic component and heat sink member heat conduction means to the air outlets and exhaust fan, the secondary air flow being isolated from the primary air flow, such that the non-isolated components and the enclosed heat generating electronic component with the heat sink member are independently cooled by the primary air flow and secondary air flow, respectively, and the heat generated by the enclosed heat generating electronic component with the heat sing member and the non-isolated components is not mixed within the cabinet to maximize cooling of all components within the cabinet.

3. Apparatus for cooling electronic components within a cabinet of the type having air inlets and air outlets and an exhaust fan which creates a primary air flow across the components between the air inlets and air outlets in the cabinet and exhausts the air to the cabinet exterior, said apparatus comprising;

an enclosure formed of electrically non-conductive material having an interior cavity configured to enclose at least one predetermined heat generating electronic component and isolate it from other electronic components in the cabinet, air inlet means on said enclosure connected with the air inlets of the cabinet and air outlet means on said enclosure connected with the air outlets of the cabinet and the exhaust fan, and said air inlet means, said enclosure, and said air outlet means defining a secondary air flow pathway from the air inlets of the cabinet across the enclosed heat generating electronic component to the air outlets and exhaust fan of the cabinet which is isolated from the primary air flow, the fan in operation creating the primary air flow across the non-isolated components between the air inlets and air outlets of the cabinet and exhausting the air to the cabinet exterior, and simultaneously creating a separate secondary air flow through said secondary air flow pathway across the enclosed heat generating electronic component between the air inlets and air outlets of the cabinet and exhausting the secondary air flow to the cabinet exterior, such that the non-isolated components and the enclosed heat generating electronic component are independently cooled by the primary air flow and said secondary air flow, respectively, and the heat generated by the enclosed heat generating electronic component and the non-isolated components is not mixed within the cabinet to maximize cooling of all components within the cabinet.

4. The apparatus according to claim 3 wherein;
said enclosure has at least one side wall and a top wall defining said interior cavity.

5. The apparatus according to claim 3 wherein;
said enclosure has four side walls and a top wall defining said interior cavity.

6. The apparatus according to claim 3 wherein;
the predetermined heat generating electronic component includes a heat sink component, and
said enclosure interior cavity is configured to enclose the predetermined heat generating electronic component and heat sink component and isolate them from other electronic components in the cabinet.

7. The apparatus according to claim 3 wherein;
said air inlet means and said air outlet means include an air inlet port and an air outlet port on said enclosure each in fluid communication with said interior cavity for directing air through said interior cavity of said enclosure, and
conduit means connecting said air inlet port on said enclosure with the air inlets of the cabinet and said air outlet port of said enclosure with the air outlets of the cabinet and the exhaust fan to isolate said secondary air flow pathway from the primary air flow pathway.

8. The apparatus according to claim 7 wherein;
said conduit means is formed of flexible tubular material.

9. The apparatus according to claim 7 wherein;
said conduit means comprises a tubular section of conduit connected at one end to said air inlet port on said enclosure and having releasable fastener means at its opposite end for releasable connection t the air inlets of the cabinet.

10. The apparatus according to claim 7 wherein;
said conduit means comprises a tubular section of conduit connected at one end to said air outlet port on said enclosure and having releasable fastener means at its opposite end for releasable connection to the air outlets of the cabinet through which air is exhausted by the fan.

11. The apparatus according to claim 7 wherein;
said conduit means comprises a first tubular section of conduit connected at one end to said air inlet port on said enclosure and having releasable fastener means at its opposite end for releasable connection to the air inlets in the cabinet, and
a second tubular section of conduit connected at one end to said air outlet port on said enclosure and having releasable fastener means at its opposite end for releasable connection to the air outlets of the cabinet through which air is exhausted by the fan.

12. The apparatus according to claim 3 including;
a heat sink element having heat conduction means disposed within said interior cavity of said enclosure, and
said enclosure with said heat sink element disposed therein is configured to be mounted on the predetermined heat generating electronic component with said enclosure enclosing the predetermined heat generating electronic component and said heat sink element and isolating them from other electronic components in the cabinet.

13. The apparatus according to claim 12 wherein;
said heat sink element conduction means comprises a series of parallel spaced fins aligned longitudinally between said air inlet means and said air outlet means on said enclosure to allow said secondary air flowing through said secondary air flow pathway to flow between said fins.

14. The apparatus according to claim 12 wherein;
said heat sink element conduction means comprises a series of upstanding pin elements positioned between said air inlet means and said air outlet means to allow said secondary air flowing through said secondary air flow pathway to flow between said pin elements.

15. The apparatus according to claim 3 wherein; said air inlet means and said air outlet means on said enclosure include a system of hollow ductwork connecting said enclosure interior cavity in fluid communication with the air inlets of the cabinet and with the air outlets of the cabinet and the exhaust fan to create said secondary air flow pathway across the enclosed heat generating electronic component.

16. A cabinet for containing and cooling heat generating electronic components comprising;

a cabinet housing having mounting means for mounting electronic components thereon and air inlets and air outlets for allowing air to pass through the cabinet interior in a primary air flow pathway across said mounting means.

a plurality of electronic components including heat generating electronic components mounted on said mounting means:

an exhaust fan connected with said housing inlets and outlets to create said primary air flow pathway across said mounting means and said components mounted thereon between said air inlets and air outlets in said cabinet housing and exhaust the air to the housing exterior;

secondary air duct means in said cabinet housing configured to enclose at least one predetermined heat generating electronic component and isolate it from other components mounted therein and to connect said enclosed component in fluid communication with said air inlets, said air outlets, and said exhaust fan;

said secondary air duct means isolated from said primary air flow pathway to define a separate secondary air flow pathway therethrough from said air inlets across said enclosed heat generating electronic component to said air outlets and said exhaust fan;

said exhaust fan in operation creating said primary air flow pathway across the non-isolated components between said air inlets and said air outlets in said cabinet housing and exhausting the air to the cabinet exterior, and simultaneously creating said separate secondary air flow pathway through said secondary air duct means across said enclosed heat generating component between said air inlets and said air outlets in said cabinet housing and exhausting the secondary air flow to the cabinet exterior, such that the non-isolated components and said enclosed heat generating electronic component are independently cooled by the primary air flow pathway and said secondary air flow pathway, respectively, and the heat generated by said enclosed heat generating component and the non-isolated components is not mixed within said cabinet housing to maximize cooling of all components within said cabinet housing.

17. The cabinet according to claim 16 wherein; said secondary air duct means includes a heat sink component.

18. The cabinet according to claim 17 wherein; said at least one predetermined heat generating electronic component includes a heat sink component, and said secondary air duct means has an interior cavity configured to enclose said at least one predetermined heat generating electronic component and said heat sink component and isolate them from other electronic components mounted within said cabinet housing.

19. The cabinet according to claim 17 wherein; said secondary air duct means includes an enclosure formed of electrically non-conductive material having an interior cavity configured to enclose said predetermined heat generating electronic component and isolate it from other electronic components in the cabinet.

20. The cabinet according to claim 20 wherein; said enclosure is removably connected with said secondary air duct means, and said enclosure has at least one side wall and a top wall defining an interior cavity configured to enclose said predetermined heat generating electronic component.

21. The cabinet according to claim 20 wherein; said enclosure has four side walls and a top wall defining an interior cavity configured to enclose said predetermined heat generating electronic component.

22. The cabinet according to claim 16 wherein; said secondary air duct means comprises a first hollow duct having one end in fluid communication with said air inlets in said cabinet housing and another end positioned adjacent to said mounting means, and a second hollow duct having one end positioned adjacent said mounting means and another end in fluid communication with said air outlets in said cabinet housing through which air is exhausted by said fan.

23. The cabinet according to claim 22 wherein; said secondary air duct means includes a removable enclosure formed of electrically non-conducive material having an interior cavity configured to removably enclose said predetermined heat generating electronic component mounted on said mounting means and isolate it from other electronic components in said cabinet housing, and to encompass the ends of said first and second ducts and adjacent said mounting means, such that air flowing through said first and second ducts flow across said enclosed heat generating component between said air inlets and said air outlets in said cabinet housing and is exhausted to exterior of said cabinet housing.

24. The cabinet according to claim 23 wherein; said enclosure includes a heat sink element in said cavity having heat conduction means, and said enclosure with said heat sink element is configured to be mounted on said predetermined heat generating electronic component with said enclosure enclosing said heat sink element and isolating said heat sink element from other electronic components in the cabinet.

* * * * *